US008593770B2

(12) United States Patent
Nakahara (10) Patent No.: US 8,593,770 B2
(45) Date of Patent: Nov. 26, 2013

(54) PROTECTION CIRCUIT

(75) Inventor: Hironori Nakahara, Kyoto (JP)

(73) Assignee: Rohm Co., Ltd. (JP)

(*) Notice: Subject to any disclaimer, the term of this patent is extended or adjusted under 35 U.S.C. 154(b) by 601 days.

(21) Appl. No.: 12/829,463

(22) Filed: Jul. 2, 2010

(65) Prior Publication Data

US 2011/0176248 A1 Jul. 21, 2011

(30) Foreign Application Priority Data

Jul. 6, 2009 (JP) .................................. 2009-159757
Jun. 1, 2010 (JP) .................................. 2010-125541

(51) Int. Cl.
*H02H 3/22* (2006.01)
*H01L 23/60* (2006.01)

(52) U.S. Cl.
USPC .............. 361/56; 361/111; 257/355; 257/546

(58) Field of Classification Search
USPC ................. 361/56, 111; 257/355, 546
See application file for complete search history.

(56) References Cited

U.S. PATENT DOCUMENTS

| 5,923,067 A * | 7/1999 | Voldman ..................... 257/349 |
| 7,511,347 B2 * | 3/2009 | Kajigaya et al. ............ 257/371 |
| 7,760,477 B1 * | 7/2010 | Watt et al. ................... 361/56 |
| 2006/0113600 A1 * | 6/2006 | Salling et al. ............... 257/360 |

FOREIGN PATENT DOCUMENTS

| JP | 11-284130 A | 10/1999 |
| JP | 2000-98338 A | 4/2000 |

* cited by examiner

*Primary Examiner* — Rexford Barnie
*Assistant Examiner* — Zeev V Kitov
(74) *Attorney, Agent, or Firm* — Cantor Colburn LLP (57) ABSTRACT

A first protection circuit includes a first diode and a first transistor. The anode of the first diode is connected to a terminal to be protected. The first transistor is configured as an N-channel MOSFET, and arranged such that the first terminal of the conduction channel thereof is connected to the cathode of the first diode, and the second terminal of the conduction channel thereof, and the gate and the back gate thereof are connected to a fixed voltage terminal. The first transistor is configured as a floating MOSFET formed within an N-type well formed in a P-type semiconductor substrate. The first diode is formed in the shared N-type well in which the first transistor is formed. The cathode of the first diode and the first terminal of the conduction channel of the first transistor are connected to the N-type well.

15 Claims, 4 Drawing Sheets

PROTECTION CIRCUIT

BACKGROUND OF THE INVENTION

1. Field of the Invention

The present invention relates to a protection circuit configured to prevent electrostatic breakdown, and particularly to a protection circuit employing a MOSFET (Metal Oxide Semiconductor Field Effect Transistor).

2. Description of the Related Art

A semiconductor integrated circuit includes pads which allow signals to be input and output. When a static electric charge or surge noise is applied to such a pad, in some cases, it affects the reliability of the circuit components included in the semiconductor integrated circuit. In order to solve such a problem, a protection circuit employing a Zener diode or the like is provided to such pads.

For example, with an arrangement in which a positive voltage signal is transmitted to such a pad to be protected, a protection diode is arranged such that the cathode thereof is connected to the pad side and the anode thereof is connected to the ground terminal side.

RELATED ART DOCUMENTS

Patent Documents

[Patent Document 1]
 Japanese Patent Application Laid Open No. H11-284130
[Patent Document 2]
 Japanese Patent Application Laid Open No. 2000-98338

However, in some cases, an audio signal, which is supplied to speakers, headphones, or the like, swings in both the positive voltage direction and the negative voltage direction with the ground electric potential as the center. If the aforementioned protection diode is connected to a terminal which transmits an audio signal, when the audio signal swings in the negative voltage direction, the direction in which the audio signal swings matches the forward direction of the protection diode, i.e., the protection diode is switched to the ON state. In this state, such an arrangement has problems in that the audio signal is clamped, or a leak current occurs. That is to say, such a technique cannot be applied to a terminal at which the electric potential can drop or fall below a voltage of the ground electric potential. Accordingly, such a technique supports only a limited voltage range, which is a problem.

Furthermore, even if such a signal swings in the positive voltage direction, if a large parasitic capacitance occurs at the protection circuit, such an arrangement has a problem in that the signal is distorted.

SUMMARY OF THE INVENTION

The present invention has been made in order to such a problem. Accordingly, it is an exemplary purpose of an embodiment of the present invention to provide a protection circuit which is capable of solving at least one problem described above.

An embodiment of the present invention relates to a protection circuit. The protection circuit comprises: a first diode arranged such that an anode thereof is connected to a terminal to be protected; and a first transistor configured as an N-channel MOSFET, and arranged such that one terminal of a conduction channel thereof is connected to a cathode of the first diode, and the other terminal of the conduction channel thereof, a gate thereof, and a back gate thereof, are connected to a fixed voltage terminal. The first transistor is configured as a floating MOSFET formed within an N-type well formed in a P-type semiconductor substrate. The first diode is formed within the shared N-type well in which the first transistor is formed. Furthermore, the cathode of the first diode and the aforementioned one terminal of the conduction channel of the first transistor are connected to the N-type well.

With such an embodiment, the body diode formed at the first transistor and the first diode function as a pair of diodes arranged such that their cathode terminals face one another. Thus, whenever overvoltage is applied to the terminal, one diode is biased in the forward direction and the other diode is biased in the reverse direction, thereby protecting the internal circuit. In the normal state, even if a signal input to the terminal to be protected has a voltage level lower than that at the fixed voltage terminal, the signal thus input is not clamped. Thus, such an arrangement supports a wide voltage range.

Another embodiment of the present invention also relates to a protection circuit. The protection circuit comprises: a second diode arranged such that a cathode thereof is connected to the terminal to be protected; and a second transistor configured as an N-channel MOSFET, and arranged such that one terminal of a conduction channel thereof, a gate thereof, and a back gate thereof are connected to an anode of the second diode, and the other terminal of the conduction channel thereof is connected to the fixed voltage terminal. The second transistor is configured as a floating MOSFET formed within an N-type well formed in the P-type semiconductor substrate. The second diode is formed within the shared N-type well in which the second transistor is formed. Furthermore, the other terminal of the conduction channel of the second transistor is connected to the N-type well.

With such an embodiment, the body diode which is formed at the second transistor and the second diode function as a pair of diodes arranged such that the anode terminals thereof face one another. Thus, whenever overvoltage is applied to the terminal, one diode is biased in the forward direction and the other diode is biased in the reverse direction, thereby protecting the internal circuit. In the normal state, even if a signal input to the terminal to be protected has a voltage level lower than that at the fixed voltage terminal, the signal thus input is not clamped. Thus, such an arrangement supports a wide voltage range.

A protection circuit according to an embodiment relates to a combination of the aforementioned two protection circuits. Even in a case in which the electric potential at the terminal to be protected swings in both the positive voltage direction and the negative voltage direction, such an embodiment is capable of protecting the internal circuit.

Also, a signal that swings with the electric potential at the fixed voltage terminal as the center may be transmitted via the terminal to be protected.

Also, the signal to be transmitted via the terminal to be protected may be an audio signal.

Also, an electroacoustic transducer may be connected to the terminal to be protected.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described feature

BRIEF DESCRIPTION OF THE DRAWINGS

Embodiments will now be described, by way of example only, with reference to the accompanying drawings which are

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
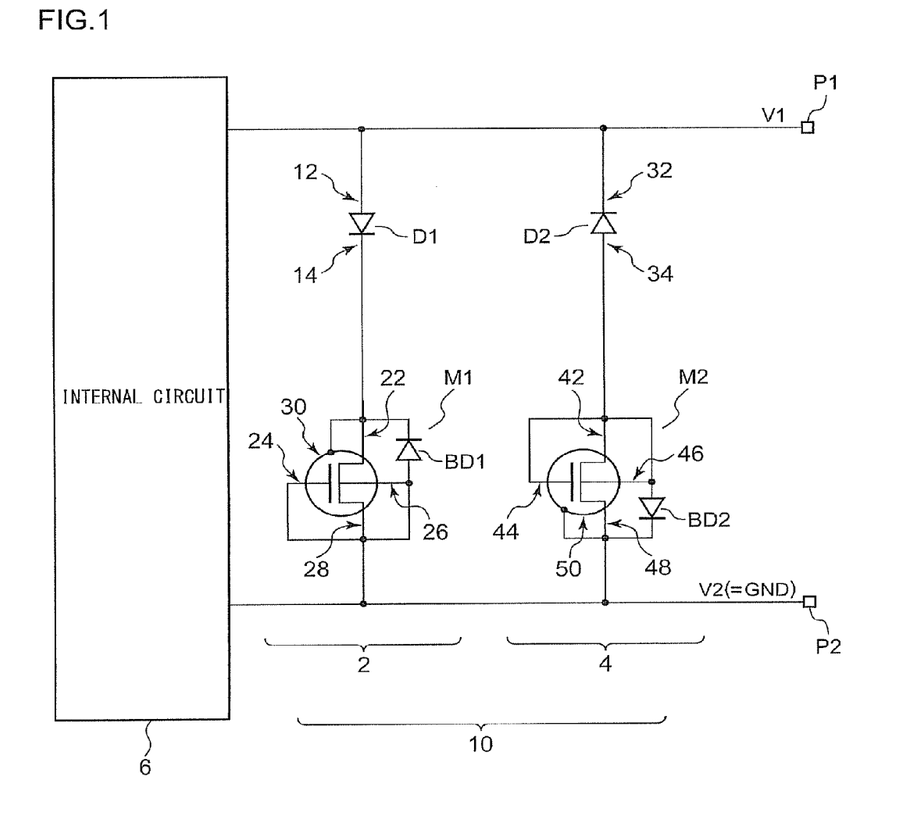
FIG. 1 is a circuit diagram which shows a configuration of a protection circuit according to an embodiment.

FIG. 1 is a circuit diagram which shows a protection circuit 10 according to an embodiment. The protection circuit 10 is arranged between an internal circuit 6 to be protected and terminals (which will also be referred to as "pads") P1 and P2. The terminal P2 is grounded, and functions as a fixed voltage terminal. The signal output from the internal circuit 6 is output to an external circuit via the terminal P1. Alternatively, a signal input from an external circuit is input to the internal circuit 6 via the terminal P1.

The protection circuit 10 is provided in order to protect the internal circuit 6 from overvoltage in a case in which an unexpected overvoltage such as electrostatic noise, a surge, etc., is applied to the terminal P1. The overvoltage can occur in either the positive voltage direction or the negative voltage direction, or can occur in both directions. That is to say, the terminal P1 is a terminal to be protected.

The protection circuit 10 includes a first protection circuit 2 and a second protection circuit 4.

The first protection circuit 2 includes a first diode D1 and a first transistor M1. An anode 12 of the first diode D1 is connected to the terminal P1 to be protected.

The first transistor M1 is configured as an N-channel MOSFET. One terminal (first terminal 22) of the conduction channel of the first transistor M1 is connected to a cathode 14 of the first diode D1. Furthermore, the other terminal (second terminal 28) of the conduction channel of the first transistor M1, a gate 24 thereof, and a back gate 26 thereof are connected to the fixed voltage terminal P2.

Detailed description will be made later regarding a device configuration of the first protection circuit 2. In brief, the first transistor M1 is configured as a floating MOSFET formed within an N-type well formed in a P-type semiconductor substrate (or otherwise as a floating MOSFET formed within a P-type well formed in an N-type semiconductor substrate). Hereafter, the N-type well (or P-type well) will be denoted by reference numeral 30 in the drawings. Description will be made below regarding an arrangement employing the N-type well.

The first diode D1 and the first transistor M1 are formed within the shared N-type well 30. Furthermore, the cathode 14 of the first diode D1 and the first terminal 22 of the conduction channel of the first transistor M1 are connected to the N-type well 30.

Next, description will be made regarding the second protection circuit 4.

The second protection circuit 4 includes a second diode D2, and a second transistor M2. A cathode 32 of the second diode D2 is connected to the terminal P1 to be protected.

The second transistor M2 is configured as an N-channel MOSFET. One terminal (first terminal 42) of the conduction channel of the second transistor M2, a gate 44 thereof, and a back gate 46 thereof are connected to an anode 34 of the second diode D2. Furthermore, the other terminal (second terminal 48) of the conduction channel of the second transistor M2 is connected to the fixed voltage terminal P2.

Detailed description will be made later regarding a device configuration of the second protection circuit 4. In brief, the second transistor M2 is configured as a floating MOSFET formed within an N-type well formed in a P-type semiconductor substrate (or otherwise as a floating MOSFET formed within a P-type well formed in an N-type semiconductor substrate). Hereafter, the N-type well (or P-type well) will be denoted by reference numeral 50 in the drawings. Description will be made below regarding an arrangement employing the N-type well.

The second diode D2 is formed in the shared N-type well 50 in which the second transistor M2 is formed. Furthermore, the other terminal (second terminal 48) of the conduction channel of the second transistor M2 is connected to the N-type well 50.

Figure 2A:
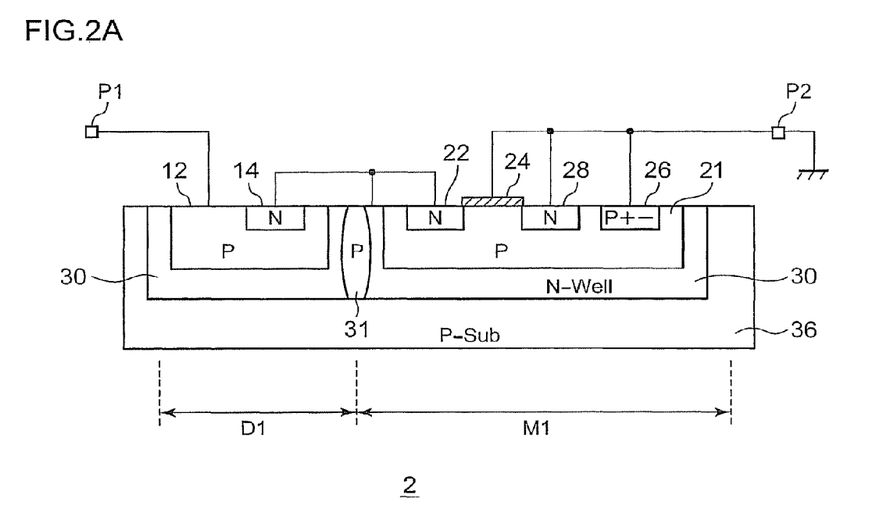
FIG. 2 is a cross-sectional diagram which shows a device structure of the protection circuit shown in FIG. 1.
Figure 2B:
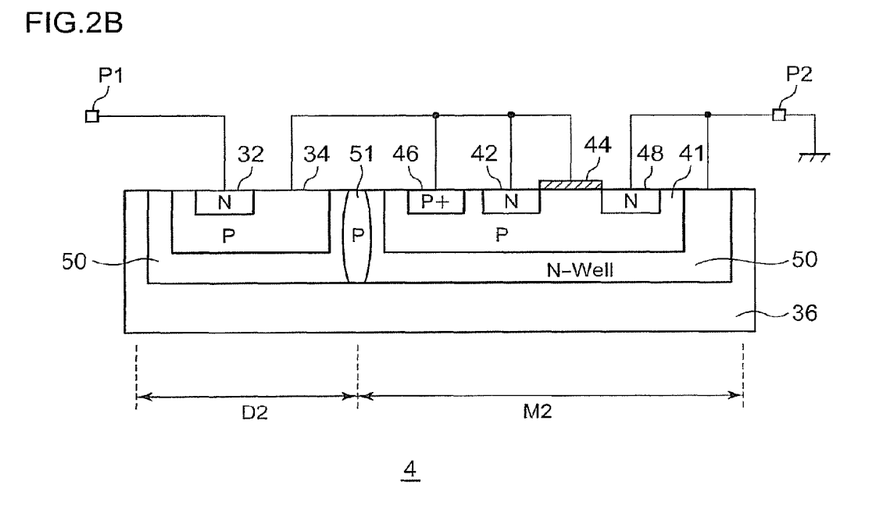

FIGS. 2A and 2B are cross-sectional diagrams which show the device configurations of the first protection circuit 2 and the second protection circuit 4 shown in FIG. 1.

Referring to FIG. 2A, the first diode D1 and the first transistor M1 are formed in a P-type semiconductor substrate (which will simply be referred to as the "P-type substrate") 36 using the MOS process. An N-type well 30 is formed as a buried layer in the P-type substrate 36. The first diode D1 and the first transistor M1 shown in FIG. 1 are formed in the shared N-type well 30 such that these device elements are isolated from one another. The first transistor M1 is configured as a so-called floating MOSFET. By isolating the adjacent diode and transistor from one another, such an arrangement prevents a parasitic diode from entering the ON state, thereby preventing breakdown.

A P-type well (12) for the first diode D1 and a P-type well 21 for the first transistor M1 are formed adjacent to one another in the shared N-type well 30. The P-type well (12) functions as an anode of the first diode D1. The P-type well 21 functions as the conduction channel of the first transistor M1. An element isolation region 31 is provided between the first diode D1 and the first transistor M1.

An N-type region (14), which functions as a cathode of the first diode D1, is formed within the P-type well (12) for the first diode D1.

In the P-type well 21, N-type regions are formed as a drain and a source of the first transistor M1, i.e., the first terminal 22 and the second terminal 28 shown in FIG. 1. A gate oxide film 24 is formed between the first terminal 22 and the second terminal 28.

The first terminal 22 of the first transistor M1 and the cathode 14 of the first diode D1 are connected to a region on the first transistor M1 side of the N-type well (buried layer) 30.

Referring to FIG. 2B, the second diode D2 and the second transistor M2 are formed in the P-type substrate 36 using the MOS process. An N-type well 50 is formed as a buried layer in the P-type substrate 36. The second diode D2 and the second transistor M2 shown in FIG. 1 are formed in the shared N-type well 50 such that these device elements are isolated from one another. The second transistor M2 is configured as a so-called floating MOSFET in the same way as with the first transistor M1.

A P-type well (34) for the second diode D2 and a P-type well 41 for the second transistor M2 are formed adjacent to one another in the shared N-type well 50. The P-type well (34) functions as the anode of the second diode D2. The P-type well 41 functions as the conduction channel of the second transistor M2. Also, an element isolation region 51 is formed between the second diode D2 and the second transistor M2.

An N-type region (32), which functions as a cathode of the second diode D2, is formed within the P-type well (34) for the second diode D2.

N-type regions are formed in the P-type well 41, which function as a drain and a source of the second transistor M2, i.e., as the first terminal 42 and the second terminal 48 shown in FIG. 1. A gate oxide film 44 is formed between the first terminal 42 and the second terminal 48.

The second terminal 48 of the second transistor M2 is connected to the N-type well (buried layer) 50.

The N-type well 30 for the first protection circuit 2 and the N-type well 50 for the second protection circuit 4 may be formed as a shared buried layer, or may be formed as separate buried layers.

The above is the configuration of the protection circuit 10. Next, description will be made regarding the operation of the protection circuit 10.

The electric potential at the terminal P1 will be referred to as the "first voltage V1", and the electric potential at the fixed voltage terminal P2 will be referred to as the "second voltage V2". In the normal state, the second voltage V2 is the ground voltage (GND=0 V), or a fixed voltage such as the power supply voltage Vdd or the like. Description will be made below assuming that V2=0 V.

The following four states can be assumed with respect to the first voltage V1 and the second voltage V2.

First state: The state in which V1>V2 due to positive overvoltage applied to the terminal P1.

Second state: The state in which V1>V2 due to negative overvoltage applied to the terminal P2.

Third state: The state in which V1<V2 due to negative overvoltage applied to the terminal P1.

Fourth state: The state in which V1<V2 due to positive overvoltage applied to the terminal P2.

Directing attention to the first protection circuit 2, between the back gate 26 of the first transistor M1 and the first terminal 22, a body diode BD1 is formed such that the cathode thereof is connected to the first terminal 22 side and the anode thereof is connected to the back gate 26 side. That is to say, two diodes, i.e., the first diode D1 and the body diode BD1, are arranged between the terminal P1 and the fixed voltage terminal P2 such that the cathodes of the two diodes face one another. Description will be made below regarding the operations in these four states.

First State

Whenever the voltage difference between the terminal P1 and the fixed voltage terminal P2 exceeds (Vf+Vz) due to positive overvoltage applied to the terminal P1, the first diode D1 is biased in the forward direction and the body diode BD1 formed at the first transistor M1 is biased in the reverse direction, thus clamping the electric potential V1 at the terminal P1 to (Vf+Vz). Here, Vf represents the forward voltage of the diode D1, and Vz represents the reverse voltage of the diode D1.

Second State

Whenever the voltage difference between the terminal P1 and the fixed voltage terminal P2 exceeds (Vf+Vz) due to negative overvoltage applied to the terminal P2, the first diode D1 is biased in the forward direction, and the body diode BD1 formed at the first transistor M1 is biased in the reverse direction. As a result, the electric potential V2 at the terminal P2 can be clamped to V1−(Vf+Vz) with the first voltage V1 as a reference voltage.

Third State

Whenever the voltage difference between the terminal P1 and the fixed voltage terminal P2 exceeds (Vf+Vz) due to negative overvoltage applied to the terminal P1, the first diode D1 is biased in the reverse direction, and the body diode BD1 formed at the first transistor M1 is biased in the forward direction. As a result, the electric potential V1 at the terminal P1 can be clamped to V2−(Vf+Vz) with the second voltage V2 as a reference voltage.

Seen from a different point of view, even if negative voltage is applied to the terminal P1, as long as the voltage difference between the terminal P1 and the fixed voltage terminal P2 does not exceed the threshold voltage (Vf+Vz), the pair of diodes is not switched to the conduction state. Thus, such an arrangement is capable of outputting, via the terminal P1, a signal which swings in a negative voltage range. Alternatively, such an arrangement is capable of receiving, as an input signal via the terminal P1, a signal which swings in a negative voltage range.

Fourth State

Whenever the voltage difference between the terminal P1 and the fixed voltage terminal P2 exceeds (Vf+Vz) due to positive overvoltage applied to the terminal P2, the first diode D1 is biased in the reverse direction, and the body diode BD1 formed at the first transistor M1 is biased in the forward direction. As a result, the electric potential V2 at the terminal P2 can be clamped to V1+(Vf+Vz) with the first voltage V1 as a reference voltage.

The above are the operations and the advantages of the first protection circuit 2.

Directing attention to the second protection circuit 4, between the back gate 46 of the second transistor M2 and the second terminal 48, a body diode BD2 is formed such that the cathode thereof is connected to the second terminal 48 side and the anode thereof is connected to the back gate 46 side. That is to say, a pair of diodes, i.e., the second diode D2 and the body diode BD2, are arranged between the terminal P1 and the fixed voltage terminal P2 such that the anodes of the two diodes face one another.

First State

Whenever the voltage difference between the terminal P1 and the fixed voltage terminal P2 exceeds (Vf+Vz) due to positive overvoltage applied to the terminal P1, the second diode D2 is biased in the reverse direction and the body diode BD2 formed at the second transistor M2 is biased in the forward direction, thereby clamping the electric potential V1 at the terminal P1 to (Vf+Vz).

Second State

Whenever the voltage difference between the fixed voltage terminal P2 and the terminal P1 exceeds (Vf+Vz) due to negative overvoltage applied to the fixed voltage terminal P2, the second diode D2 is biased in the reverse direction, and the body diode BD2 formed at the second transistor M2 is biased in the forward direction. As a result, the electric potential V2 at the fixed voltage terminal P2 can be clamped to V1−(Vf+Vz) with the first voltage V1 as a reference voltage.

Third State

Whenever the voltage difference between the terminal P1 and the fixed voltage terminal P2 exceeds (Vf+Vz) due to negative overvoltage applied to the terminal P1, the second diode D2 is biased in the forward direction, and the body diode BD2 formed at the second transistor M2 is biased in the reverse direction. As a result, the electric potential V1 at the terminal 91 can be clamped to V2−(Vf+Vz) with the second voltage V2 as the reference voltage.

Seen from a different point of view, even if negative voltage is applied to the terminal P1, as long as the voltage difference between the terminal P1 and the fixed voltage terminal P2 does not exceed the threshold voltage (Vf+Vz), the pair of diodes is not switched to the conduction state. Thus, such an arrangement is capable of outputting, via the terminal P1, a signal which swings in a negative voltage range. Alternatively, such an arrangement is capable of receiving, as an input signal via the terminal P1, a signal which swings in a negative voltage range.

Fourth State

Whenever the voltage difference between the terminal P1 and the fixed voltage terminal P2 exceeds (Vf+Vz) due to positive overvoltage applied to the terminal 92, the second diode D2 is biased in the forward direction, and the body diode BD2 formed at the second transistor M2 is biased in the reverse direction. As a result, the electric potential V1 at the terminal 21 can be clamped to V2−(Vf+Vz) with the second voltage V2 as a reference voltage.

The above are the operations and the advantages of the second protection circuit 4.

As described above, by providing the protection circuit 10 comprising either the first protection circuit 2 or the second protection circuit 4, such an arrangement is capable of protecting the internal circuit 6 from both positive and negative overvoltages (the first state through the fourth state). However, both the first protection circuit 2 and the second protection circuit 4 are preferably employed as a pair of protection circuits, which provides the following advantages. These advantages can be clearly understood by comparing an arrangement employing such a pair of protection circuits with an arrangement employing only the first protection circuit 2 or the second protection circuit 4.

First, description will be made regarding an arrangement employing only the first protection circuit 2. In the third or fourth state, the first diode D1 is biased in the reverse direction. In general, with diodes of the same size, the quantity of allowable current in the reverse direction is smaller than in the forward direction. Accordingly, in order to protect all the first through fourth states by means of only the first protection circuit 2, the first diode D1 must be formed having a large size. If the size of first diode D1 is large, it leads to a large parasitic capacitance between the terminal P1 and the P-type substrate 36, which produces distortion in the signal transmitted via the terminal P1.

The same can be said of an arrangement employing only the second protection circuit 4.

With an arrangement in which both the first protection circuit 2 and the second protection circuit 4 are provided, the first protection circuit 2 mainly protects against the first state and the second state, and the second protection circuit 4 mainly protects against the third state and the fourth state. This allows the size of the first diode D1 included in the first protection circuit 2 and the size of the second diode D2 included in the second protection circuit 4 to be designed assuming that the diodes are to be biased in the forward direction. As a result, such an arrangement allows the size of the first diode D1 and the size of the second diode D2 to be reduced. This significantly reduces the parasitic capacitance that occurs between the terminal P1 and the P-type substrate 36, consequently reducing signal distortion.

The protection circuit 10 according to the embodiment is capable of protecting the terminal P1 from negative voltage applied to the terminal P1. Thus, the protection circuit 10 according to the embodiment can be employed in the following applications.

Figure 3:
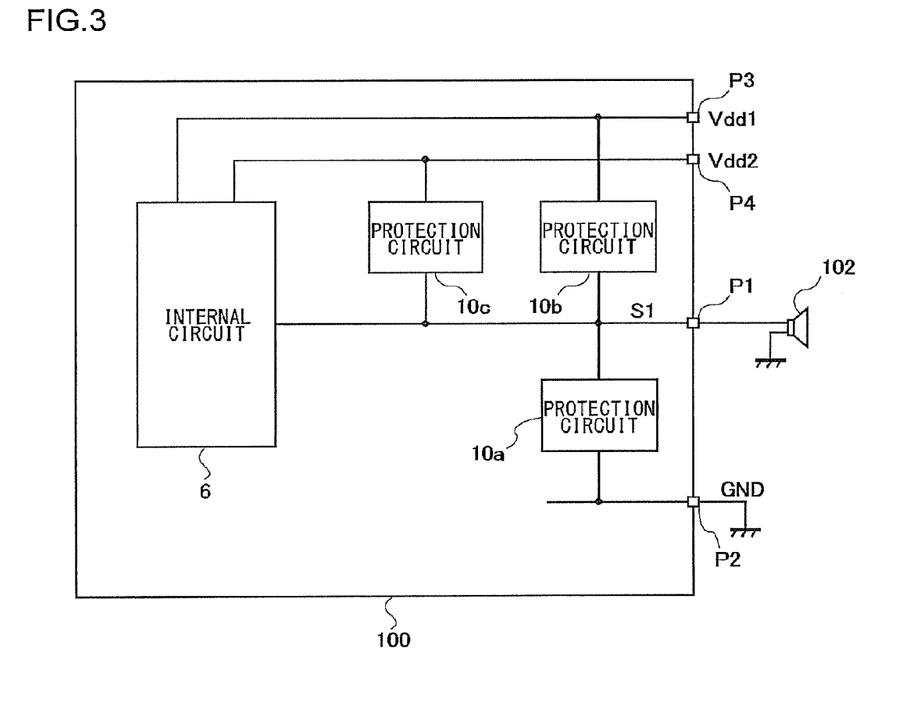
FIG. 3 is a circuit diagram which shows a configuration of a semiconductor apparatus including the protection circuit shown in FIG. 1.

FIG. 3 is a circuit diagram which shows a semiconductor apparatus 100 including the protection circuit 10 shown in FIG. 1. The semiconductor apparatus 100 includes the internal circuit 6, and at least one of the protection circuits 10a through 10c. The function of the semiconductor circuit 100 is not restricted in particular. For example, the semiconductor apparatus 100 has a function of outputting an audio signal S1 to an electroacoustic transducer (which will be referred to as a "speaker" hereafter) 102 such as speakers, headphones, or the like. With such an arrangement, in a case in which an acoustic signal is output by driving the speaker 102, the electric potential at the terminal P1 swings with the ground electric potential as the center.

The semiconductor apparatus 100 includes the fixed voltage terminal 22 and multiple power supply terminals P3 and P4, in addition to the output terminal P1. The internal circuit 6 receives the power supply voltages Vdd1 and Vdd2 supplied to the power supply terminals P3 and P4, and outputs the audio signal S1.

The audio signal S1 is transmitted to the terminal P1, which swings in both the positive voltage direction and the negative voltage direction with the ground electric potential as the center. Thus, by employing the protection circuit 10 according to the embodiment, such an arrangement is capable of suitably protecting the internal circuit 6 from overvoltage applied to the terminal P1 without having an effect on transmission of the audio signal S1.

For example, a protection circuit 10a is arranged between the terminal p1 and the fixed voltage terminal P2. Furthermore, a protection circuit 10b is arranged between the terminal P1 and the power supply terminal P3. A protection circuit 10c is arranged between the terminal P1 and the power supply terminal P4.

The most important component, or the component that provides the most effective function, for protecting the internal circuit 6 is the protection circuit 10a arranged between the terminal P1 and the fixed voltage terminal P2. Thus, in a case in which reduction in the circuit area is prioritized, only the protection circuit 10a is preferably provided.

Furthermore, in order to raise the resistance to surge noise or the like, at least one of the protection circuits 10b and 10c should be arranged between the terminal P1 and the power supply terminal P3, or between the terminal P1 and the power supply terminal P4. Preferably, protection circuits 10b and 10c should both be provided between the terminal P1 and the power supply terminal P3 and between the terminal P1 and the power supply terminal P4.

The internal circuit 6 may include an amplifier configured to amplify the audio signal 31. Also, the internal circuit 6 may be configured as a simple input selector (multiplexer) configured to select and output one of multiple input audio signals.

Also, the internal circuit 6 may be an output selector (demultiplexer) configured to output the audio signal S1 via any one of multiple output terminals. In this case, a protection circuit 10 is preferably provided for each of the output terminals.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding the protection circuit 10 formed on a P-type semiconductor substrate. Also, the protection circuit 10 may be formed on an N-type semiconductor substrate. In this case, the first transistor M1 and the second transistor M2 are each configured as a P-channel MOSFET. Furthermore, the device structure of such a modification can be obtained by mutually substituting the N-channel type and the P-channel type included in the device configuration shown in FIG. 2.

Such a modification is also capable of suitably protecting the internal circuit without obstruction of the signal transmission.

A first protection circuit according to such a modification includes: a first diode arranged such that the anode thereof is connected to the terminal to be protected; and a first transistor configured as a P-channel MOSFET, and arranged such that one terminal of the conduction channel thereof, the gate thereof, and the back gate thereof are connected to the cathode of the first diode, and the other terminal of the conduction channel is connected to the fixed voltage terminal. The first transistor is configured as a floating MOSFET formed within a P-type well formed in the N-type semiconductor substrate. The first diode is formed within the shared P-type well in which the first transistor is formed. The other terminal of the conduction channel of the first diode is connected to the P-type well.

Similarly, a second protection circuit according to a modification includes: a second diode arranged such that the cathode thereof is connected to the terminal to be protected; and a second transistor configured as a P-channel MOSFET, and arranged such that one terminal of the conduction channel thereof is connected to the anode of the second diode, and the other terminal of the conduction channel thereof, the gate thereof, and the back gate thereof, are connected to the fixed voltage terminal. The second transistor is configured as a floating MOSFET formed within the P-type well formed in the N-type semiconductor substrate. The second diode is formed within the shared P-type well in which the second transistor is formed. One terminal of the conduction channel of the second transistor is connected to the P-type well.

Figure 4A:
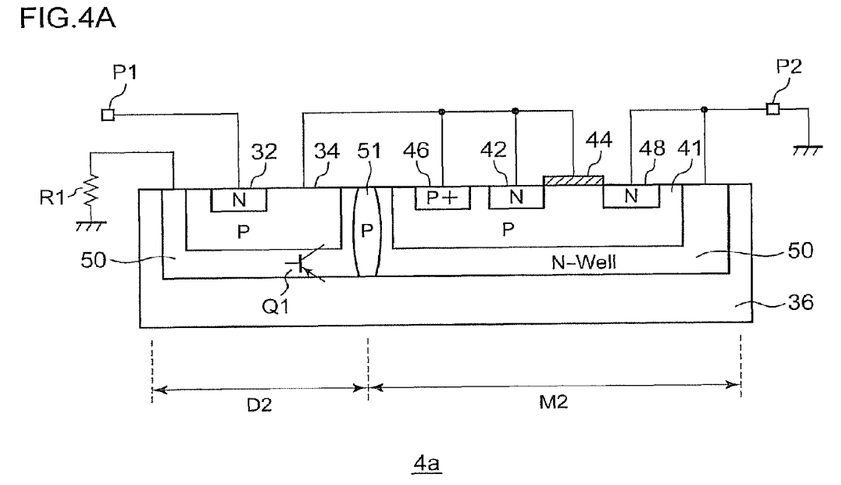
FIG. 4A is a cross-sectional diagram which shows a modification of a second protection circuit.

FIG. 4A is a cross-sectional diagram which shows a modification of the second protection circuit. A second protection circuit 4a shown in FIG. 4A includes a protection resistor R1, in addition to the second protection circuit 4 shown in FIG. 2B. The protection resistor R1 is arranged between the ground terminal and a region of the N-type well 50 that is closer to the second diode D2 side than it is to the isolation region 51.

Figure 4B:
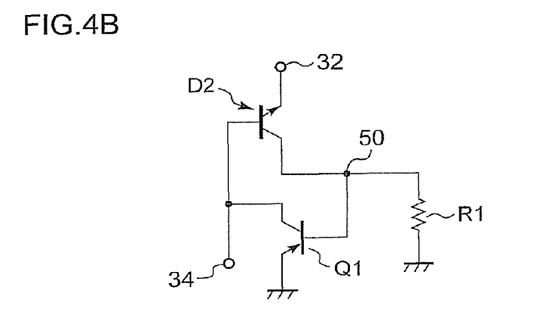
FIG. 4B is an equivalent circuit diagram which shows components around a second diode shown in FIG. 4A.

FIG. 4B is an equivalent circuit diagram which shows components around the second diode D2 shown in FIG. 4A. In the region around the second diode D2, a PNP parasitic transistor Q1 is formed having an anode 34 as the collector thereof, having the N-type well 50 on the second diode D2 side as the base thereof, and having the P-type semiconductor as the emitter thereof. Also, the second diode D2 is equivalent to an NPN bipolar transistor having the cathode 32 as the emitter thereof, having the anode 34 as the base thereof, and having the N-type well 50 as the collector thereof.

With such an arrangement, if the N-type well 50 is open as shown in FIG. 2B, the parasitic transistor Q1 is in danger of switching on when negative voltage is applied to the N-type well 50, leading to a problem of a current flowing to the ground. In order to solve such a problem, by providing the resistor R1 as shown in FIG. 4A, such an arrangement prevents the parasitic transistor Q1 from switching on, thereby preventing unnecessary current from flowing.

While the preferred embodiments of the present invention have been described using specific terms, such description is for illustrative purposes only, and it is to be understood that changes and variations may be made without departing from the spirit or scope of the appended claims.

What is claimed is:

1. A protection circuit comprising:
a first diode arranged such that an anode thereof is connected to a terminal to be protected;
a first transistor configured as an N-channel MOSFET, and arranged such that one terminal of a conduction channel thereof is connected to a cathode of the first diode, and the other terminal of the conduction channel thereof, a gate thereof, and a back gate thereof, are connected to a fixed voltage terminal, and
a protection resistor arranged between a ground terminal and a region of the well in which the second transistor and the second diode are formed, with the aforementioned region being closer to the second diode side than it is to the isolation region
wherein the first transistor is configured as a floating MOSFET formed within an N-type well formed in a P-type semiconductor substrate,
wherein the first diode is formed within the shared N-type well in which the first transistor is formed, and wherein the cathode of the first diode and the aforementioned one terminal of the conduction channel of the first transistor are connected to the N-type well;
wherein the second transistor and the second diode are formed such that they are isolated from one another.

2. A protection circuit comprising:
a second diode arranged such that a cathode thereof is connected to a terminal to be protected;
a second transistor configured as an N-channel MOSFET, and arranged such that one terminal of a conduction channel thereof, a gate thereof, and a back gate thereof are connected to an anode of the second diode, and the other terminal of the conduction channel thereof is connected to a fixed voltage terminal, and
a protection resistor arranged between a ground terminal and a region of the well in which the second transistor and the second diode are formed, with the aforementioned region being closer to the second diode side than it is to the isolation region
wherein the second transistor is configured as a floating MOSFET formed within an N-type well formed in a P-type semiconductor substrate,
wherein the second diode is formed within the shared N-type well in which the second transistor is formed, and wherein the other terminal of the conduction channel of the second transistor is connected to the N-type well; and wherein the second transistor and the second diode are formed such that they are isolated from one another.

3. A protection circuit comprising:
a first diode arranged such that an anode thereof is connected to a terminal to be protected;
a first transistor configured as an N-channel MOSFET, and arranged such that one terminal of a conduction channel thereof is connected to a cathode of the first diode, and the other terminal of the conduction channel thereof, a gate thereof, and a back gate thereof, are connected to a fixed voltage terminal,
a second diode arranged such that a cathode thereof is connected to the terminal to be protected;
a second transistor configured as a P-channel MOSFET, and arranged such that one terminal of a conduction channel thereof is connected to an anode of the second diode, and the other terminal of the conduction channel thereof, a gate thereof, and a back gate thereof, are connected to the fixed voltage terminal,
a protection resistor arranged between a ground terminal and a region of the well in which the second transistor and the second diode are formed, with the aforementioned region being closer to the second diode side than it is to the isolation region;
wherein the first transistor is configured as a floating MOSFET formed within an N-type well formed in a P-type semiconductor substrate,
wherein the first diode is formed within the shared N-type well in which the first transistor is formed, and wherein the cathode of the first diode and the aforementioned one terminal of the conduction channel of the first transistor are connected to the N-type well;
wherein the second transistor is configured as a floating MOSFET formed within a P-type well formed in the N-type semiconductor substrate,
wherein the second diode is formed within the shared P-type well in which the second transistor is formed, and wherein the aforementioned one terminal of the conduction channel of the second transistor is connected to the P-type well
wherein the second transistor and the second diode are formed such that they are isolated from one another.

4. A protection circuit comprising:
a second diode arranged such that a cathode thereof is connected to a terminal to be protected;
a second transistor configured as a P-channel MOSFET, and arranged such that one terminal of a conduction channel thereof is connected to an anode of the second diode, and the other terminal of the conduction channel thereof, a gate thereof, and a back gate thereof, are connected to a fixed voltage terminal, and a protection resistor arranged between a ground terminal and a region of the well in which the second transistor and the second diode are formed, with the aforementioned region being closer to the second diode side than it is to the isolation region;
wherein the second transistor is configured as a floating MOSFET formed within a P-type well formed in an N-type semiconductor substrate,
wherein the second diode is formed within the shared P-type well in which the second transistor is formed, and wherein the aforementioned one terminal of the conduction channel of the second transistor is connected to the P-type well;
wherein the second transistor and the second diode are formed such that they are isolated from one another.

5. A protection circuit according to claim 1, wherein the first transistor and the first diode are formed such that they are isolated from one another.

6. A protection circuit according to claim 2, wherein the first transistor and the first diode are formed such that they are isolated from one another.

7. A protection circuit according to claim 3, wherein the first transistor and the first diode are formed such that they are isolated from one another.

8. A protection circuit according to claim 4, wherein the first transistor and the first diode are formed such that they are isolated from one another.

9. A protection circuit according to claim 1, wherein a signal that swings with the electric potential at the fixed voltage terminal as the center is transmitted via the terminal to be protected.

10. A protection circuit according to claim 2, wherein a signal that swings with the electric potential at the fixed voltage terminal as the center is transmitted via the terminal to be protected.

11. A protection circuit according to claim 4, wherein a signal that swings with the electric potential at the fixed voltage terminal as the center is transmitted via the terminal to be protected.

12. A protection circuit according to claim 9, wherein the signal to be transmitted via the terminal to be protected is an audio signal.

13. A protection circuit according to claim 10, wherein the signal to be transmitted via the terminal to be protected is an audio signal.

14. A protection circuit according to claim 12, wherein an electroacoustic transducer is connected to the terminal to be protected.

15. A protection circuit according to claim 13, wherein an electroacoustic transducer is connected to the terminal to be protected.

* * * * *